(12) United States Patent
Kayama et al.

(10) Patent No.: US 8,231,343 B2
(45) Date of Patent: Jul. 31, 2012

(54) AXIAL FAN APPARATUS, AXIAL-FLOW IMPELLER, AND ELECTRONIC APPARATUS

(75) Inventors: Shun Kayama, Saitama (JP); Yukiko Shimizu, Saitama (JP); Kazutoshi Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 1001 days.

(21) Appl. No.: 12/045,376

(22) Filed: Mar. 10, 2008

(65) Prior Publication Data
US 2008/0225480 A1   Sep. 18, 2008

(30) Foreign Application Priority Data

Mar. 12, 2007 (JP) ................................ 2007-061371

(51) Int. Cl.
*F01D 5/14* (2006.01)
(52) U.S. Cl. ........ 415/220; 416/228; 416/237; 416/238; 454/184
(58) Field of Classification Search .............. 416/210 R, 416/211, 237, 238, 228; 415/220; 361/695; 454/184
See application file for complete search history.

(56) References Cited

U.S. PATENT DOCUMENTS

| 1,604,448 | A | * | 10/1926 | Hosch | 415/223 |
|---|---|---|---|---|---|
| 4,664,593 | A | * | 5/1987 | Hayashi et al. | 415/119 |
| 5,297,617 | A | * | 3/1994 | Herbert | 165/80.3 |
| 5,437,541 | A | * | 8/1995 | Vainrub | 416/223 R |
| 6,517,315 | B2 | * | 2/2003 | Belady | 415/221 |
| 7,110,255 | B2 | * | 9/2006 | Ko et al. | 361/695 |
| 7,438,522 | B2 | * | 10/2008 | Eimer | 415/173.6 |

FOREIGN PATENT DOCUMENTS

| GB | 2050530 | * | 1/1981 |
|---|---|---|---|
| JP | 1991-121299 | | 5/1991 |
| JP | 1998-018995 | | 1/1998 |
| JP | 2000-314394 | | 11/2000 |
| JP | 2002-364594 | | 12/2002 |
| JP | 2006-200457 | | 8/2006 |

OTHER PUBLICATIONS

Japanese Office Action dated Jul. 6, 2011 for Japanese Application No. 2007-061371.

* cited by examiner

*Primary Examiner* — Edward Look
*Assistant Examiner* — Liam McDowell
(74) *Attorney, Agent, or Firm* — SNR Denton US LLP (57) ABSTRACT

Provided is an axial fan apparatus including a housing and an axial-flow impeller. The axial-flow impeller is capable of rotating inside the housing and includes a plurality of axial-flow wings each having a negative pressure generation surface for generating a negative pressure, and an auxiliary vane standing on the negative pressure generation surface at an end portion of each of the plurality of axial-flow wings.

5 Claims, 9 Drawing Sheets

Rotational Direction

AXIAL FAN APPARATUS, AXIAL-FLOW IMPELLER, AND ELECTRONIC APPARATUS

CROSS REFERENCES TO RELATED APPLICATIONS

The present invention contains subject matter related to Japanese Patent Application JP 2007-061371 filed in the Japanese Patent Office on Mar. 12, 2007, the entire contents of which being incorporated herein by reference.

BACKGROUND OF THE INVENTION

1. Field of the Invention

The present invention relates to an axial fan apparatus for cooling a heat generation source or a heating element, or generating airflows in an axial direction, an axial-flow impeller mounted to the axial fan apparatus, and an electronic apparatus mounted with the axial fan apparatus.

2. Description of the Related Art

Up to now, fans focusing on noise reduction have been proposed. For example, Japanese Patent Application Laid-open No. 2006-200457 (paragraph (0017), FIGS. 1 and 2) discloses a fan including an impeller provided with wings each having bumps in a sectional shape thereof. By thus providing the bumps to each of the wings, noises are reduced because air eddies generated in the wings are released at the bump portions before the air eddies grow sufficiently.

SUMMARY OF THE INVENTION

However, even when the bumps are provided to the wings, the air eddy may still remain at each bump as shown in FIG. 1 of Japanese Patent Application Laid-open No. 2006-200457. Therefore, noises are not reduced. In actuality, the inventors of the present invention have conducted an experiment on noises using an impeller having wings with bumpy sections. However, no improvement in noise was found.

In view of the above-mentioned circumstances, there is a need for providing an axial fan apparatus, an axial-flow impeller, and an electronic apparatus mounted with the axial fan apparatus, which are capable of positively reducing noises.

According to an embodiment of the present invention, there is provided an axial fan apparatus including a housing and an axial-flow impeller. The axial-flow impeller is capable of rotating inside the housing and includes a plurality of axial-flow wings each having a negative pressure generation surface for generating a negative pressure, and an auxiliary vane standing on the negative pressure generation surface at an end portion of each of the plurality of axial-flow wings.

In the embodiment of the present invention, because the auxiliary vane is provided at the end portion of each of the plurality of axial-flow wings, an airflow separation phenomenon is suppressed at the end portion of the axial-flow wings. In other words, generation of air eddies can be suppressed to thereby reduce noise. In a case where no auxiliary vane is provided, for example, air eddies that flow in from a discharge port side of the housing to a suction port side are generated. However, in the embodiment of the present invention, because the auxiliary vane is provided so as to stand upwardly on the negative pressure generation surface, it is possible to rectify the airflows that flow in from the discharge port side of the housing to the suction port side.

In the embodiment of the present invention, the auxiliary vane includes an edge provided so as to be lined along a rotational direction of the axial-flow impeller. As described above, the provision of the edges substantially parallel to the rotational direction facilitates rectification of airflows.

In the embodiment of the present invention, the housing includes a sidewall on which a plurality of vent holes are formed. Through rotation of the axial-flow impeller, airflows that flow in from the vent holes facilitate rectification by the auxiliary vanes. Therefore, noises can be further reduced and a blast volume can be increased.

In the embodiment of the present invention, the sidewall includes an annular inner circumferential surface and an annular outer circumferential surface. Specifically, thickness of the sidewall is substantially constant. Therefore, a total area of openings of the vent holes can be increased as compared to the case of a sidewall composed of an annular inner circumferential surface and planar outer circumferential surfaces, that is, sidewall with excessive thickness, for example. The housing having the sidewall with excessive thickness generally is of a rectangular parallelepiped shape. Thus, as compared to the case where vent holes are formed on such planar sidewalls, it is possible to increase the number of vent holes in the case where the vent holes are formed on the annular sidewall as in the embodiment of the present invention. Accordingly, it becomes possible to increase an intake volume as well as the blast volume.

According to another embodiment of the present invention, there is provided an axial-flow impeller provided in an axial fan apparatus having a housing, including a boss portion, a plurality of axial-flow wings, and an auxiliary vane. The boss portion is provided to be rotatable inside the housing. The plurality of axial-flow wings each have a negative pressure generation surface for generating a negative pressure and are provided on a periphery of the boss portion. The auxiliary vane stands on the negative pressure generation surface at an end portion of each of the plurality of axial-flow wings.

According to still another embodiment of the present invention, there is provided an electronic apparatus including a casing, a housing, and an axial-flow impeller. The housing is disposed inside the casing. The axial-flow impeller is capable of rotating inside the housing and includes a plurality of axial-flow wings and an auxiliary vane. The plurality of axial-flow wings each have a negative pressure generation surface for generating a negative pressure. The auxiliary vane stands on the negative pressure generation surface at an end portion of each of the plurality of axial-flow wings.

As described above, according to the embodiments of the present invention, it is possible to positively reduce noises.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings.

Figure 1:
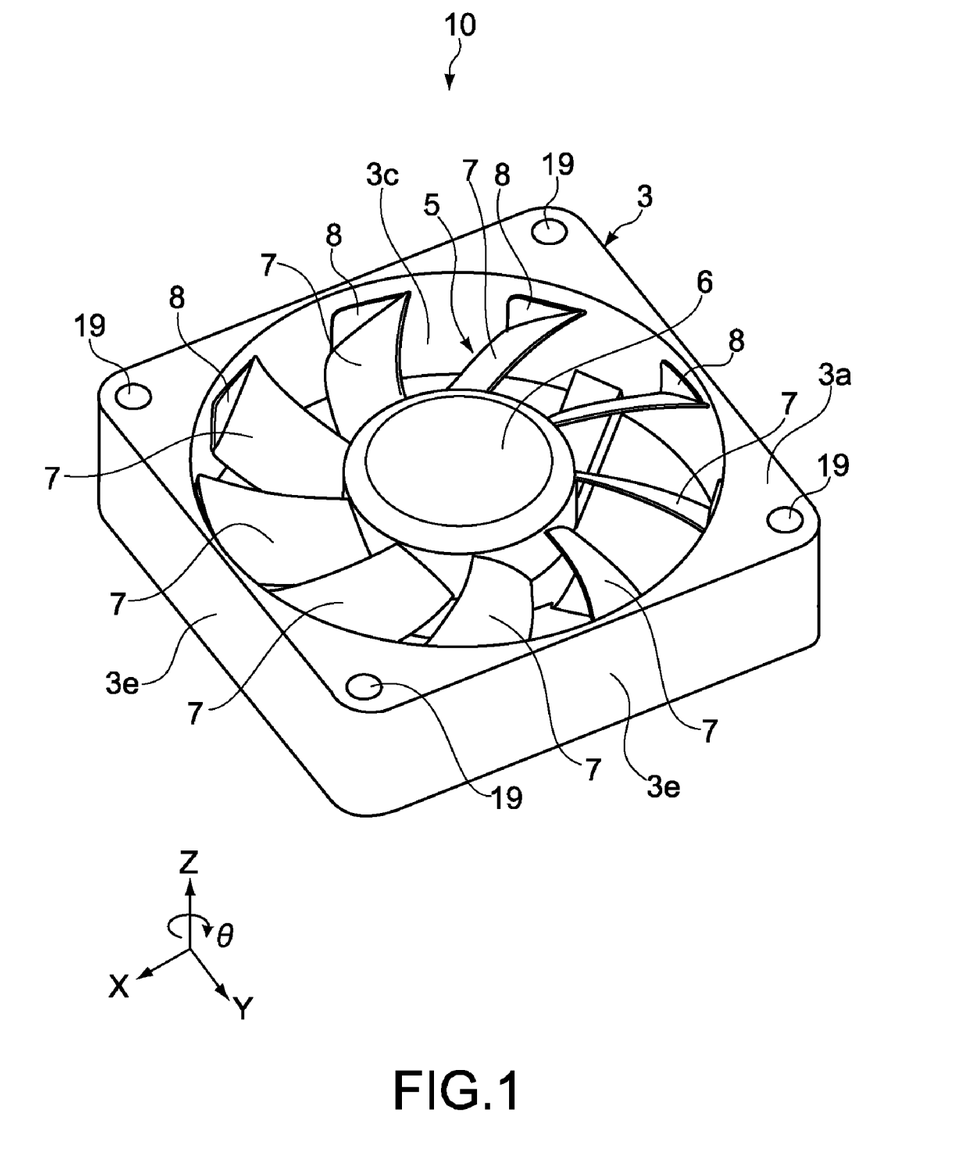
FIG. 1 is a perspective view showing an axial fan apparatus according to an embodiment of the present invention.
Figure 2:
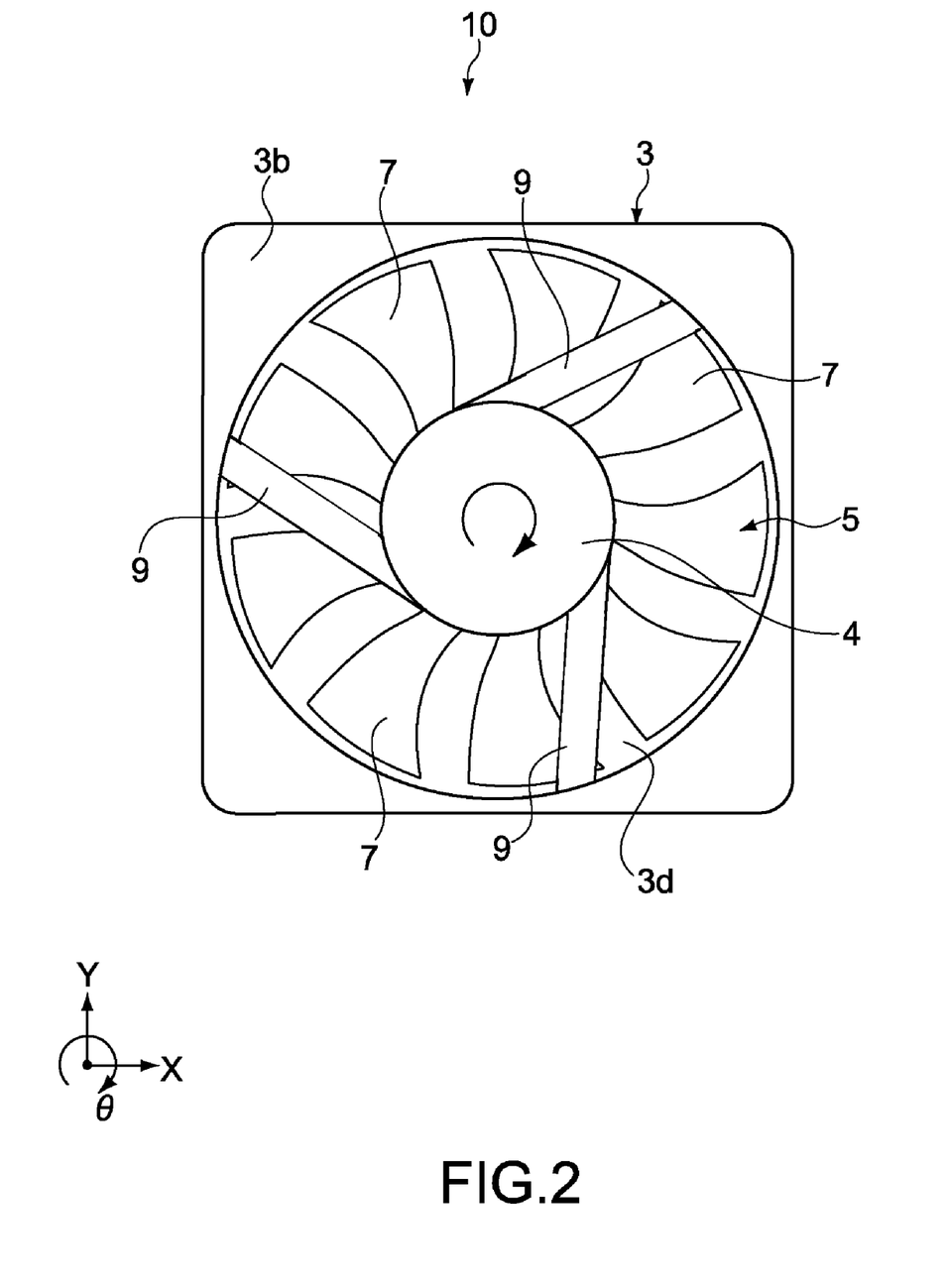
FIG. 2 is a plan view showing the axial fan apparatus shown in FIG. 1 on a back surface side.

FIG. 1 is a perspective view showing an axial fan apparatus according to an embodiment of the present invention. FIG. 2 is a plan view showing the axial fan apparatus 10 shown in FIG. 1.

The axial fan apparatus 10 includes a housing 3 and an axial-flow impeller 5 provided to be rotatable inside the housing 3. The axial-flow impeller 5 includes a boss portion 6 into which a motor (not shown) is incorporated, and a plurality of axial-flow wings 7 provided around the boss portion 6.

An opening on a top surface 3a of the housing 3 functions as a suction port 3c that sucks into the housing 3 airflows generated in an axial-flow direction (Z-axis direction) by rotation of the axial-flow wings 7 in a θ direction. As shown in FIG. 2, a bottom surface 3b of the housing 3 is provided with a discharge port 3d for discharging air sucked into the housing 3 from the suction port 3c. A retention plate 4 coupled to ribs 9 and retaining the motor is disposed in the discharge port 3d. A circuit board (not shown) for driving the motor is provided on the retention plate 4, and the motor is disposed inside the boss portion 6 above the circuit board.

It should be noted that the housing 3 is of a rectangular parallelepiped shape and has screw holes 19 for fixing screws formed on four corners thereof.

Figure 3A:
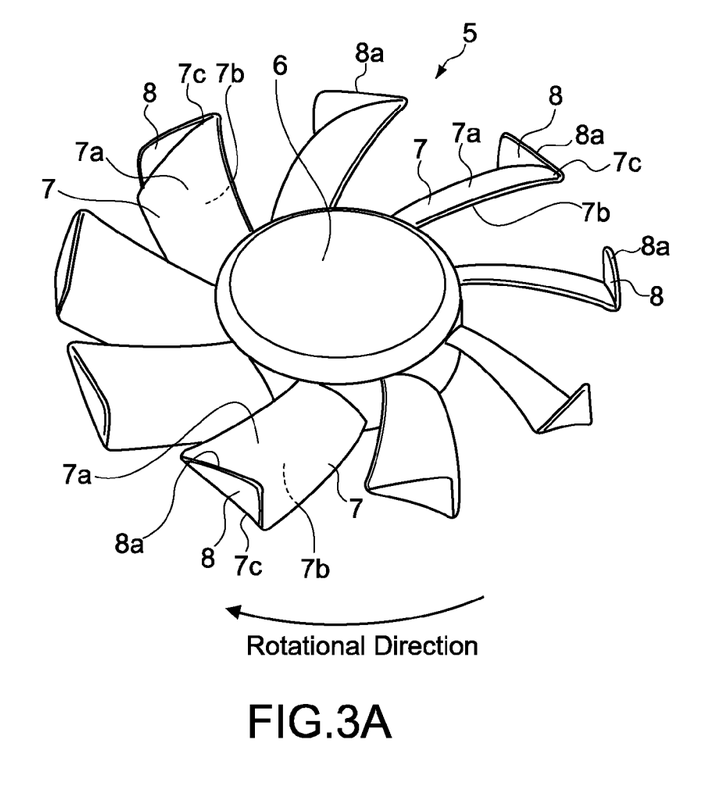
FIGS. 3A and 3B are perspective views showing an axial-flow impeller.

FIG. 3A is a perspective view showing the axial-flow impeller 5. An auxiliary vane 8 is formed on an end portion of each of the axial-flow wings 7 of the axial-flow impeller 5. The auxiliary vane 8 is provided so as to stand upwardly on a negative pressure generation surface 7a of the axial-flow wing 7, for generating a negative pressure. Typically, an angle by which the auxiliary vane 8 stands from a horizontal plane (X-Y plane) is substantially 90 degrees. However, the angle may be set to 70 to 110 degrees, or may be set to an angle outside this range.

Figure 3B:
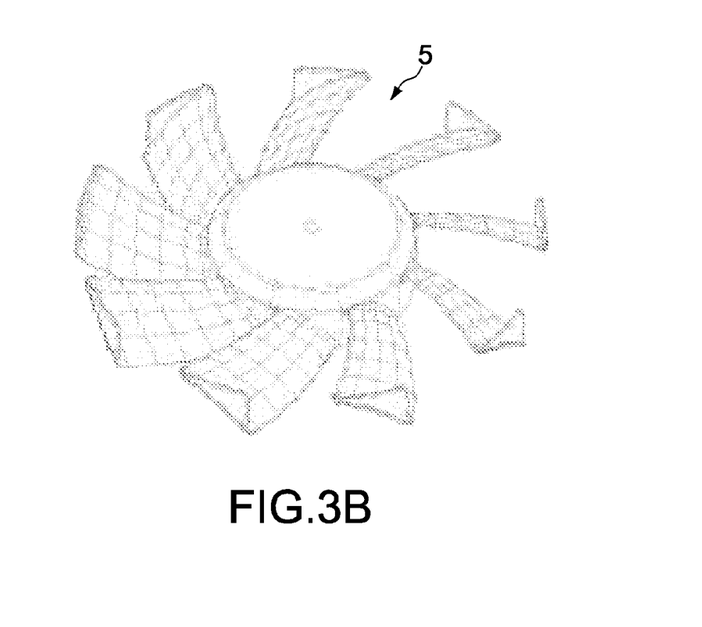

FIG. 3B is a view for illustrating that the negative pressure generation surface 7a is a curved surface.

Each of the auxiliary vanes 8 has an edge 8a provided so as to be lined along the rotational direction of the axial-flow impeller 5. In other words, the line of the edges 8a is substantially parallel to the horizontal plane (X-Y plane).

The axial-flow impeller 5 is typically made of a resin, but may be made of metal, rubber, or the like. Similarly, the housing 3 is typically made of a resin, but may be made of other materials.

An operation of the axial fan apparatus 10 structured as described above will be described.

Figure 4:
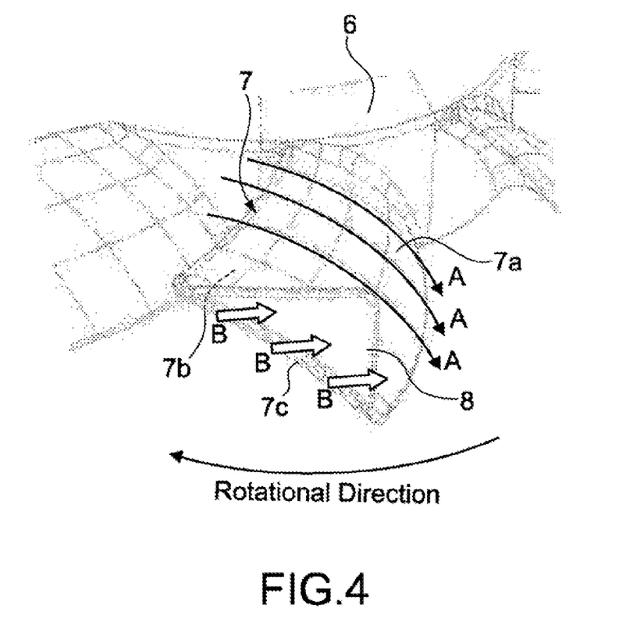
FIG. 4 is a view in the vicinity of an auxiliary vane.

The driving of the motor causes the axial-flow impeller 5 to rotate. The rotational direction of the axial-flow wings 7 is clockwise seen from the top surface side shown in FIG. 1. As shown in FIG. 4, the rotation of the axial-flow impeller 5 generates airflows A on the negative pressure generation surface 7a of the axial-flow wings 7, to thereby generate a negative pressure in the vicinity of the negative pressure generation surface 7a. Thus, airflows are generated from the suction port 3c of the housing 3 in the axial-flow direction, and the air is discharged from the discharge port 3d.

Further, as shown in FIG. 4, the generation of the negative pressure on the negative pressure generation surface 7a causes the following phenomenon. Specifically, the airflows tend to flow into the negative pressure generation surface 7a side from a surface 7b (on the other side of the negative pressure generation surface 7a) side of the axial-flow wing 7, which is opposed to the discharge port 3d of the housing 3, via the end portion 7c on an outer circumferential side of the axial-flow wing 7. However, the auxiliary vane 8 rectifies the airflows that try to flow in (shown as airflow B). In other words, the airflow B becomes a laminar flow.

Figure 5:
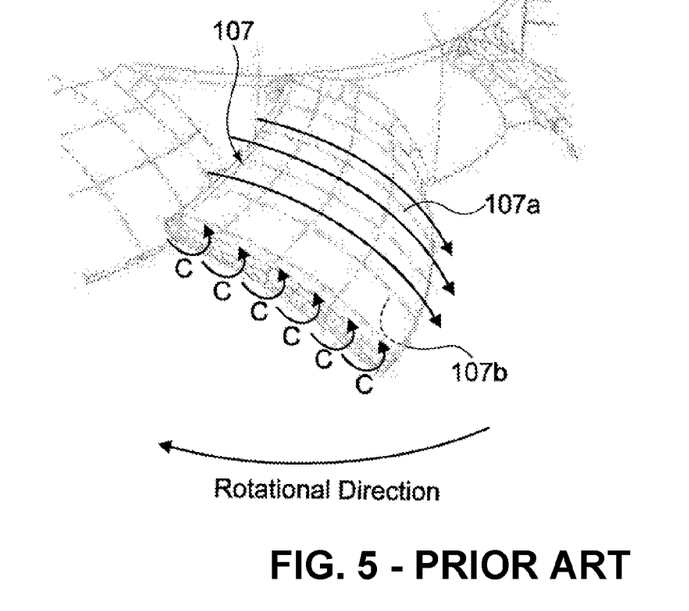
FIG. 5 is a view showing an axial-flow wing of the related art in the vicinity of an end portion thereof.

FIG. 5 is a view showing a generally-used axial-flow impeller with no auxiliary vane 8. When no auxiliary vane 8 is provided, air eddies C of airflows that try to flow in from a back surface 107b side of the axial-flow wing 107 to a negative pressure generation surface 107a side thereof are generated. When the auxiliary vanes 8 are provided as in this embodiment, it is possible to suppress generation of such air eddies C. Accordingly, noises can be reduced.

In this embodiment, the edges 8a of the auxiliary vanes 8 are provided so as to be lined along the rotational direction of the axial-flow impeller 5 as described above, with the result that an operation in which the airflows generated at the end portion 7c of the axial-flow wings 7 flow in the rotational direction is facilitated. In other words, the rectification of the auxiliary vanes 8 is facilitated.

Figure 6:
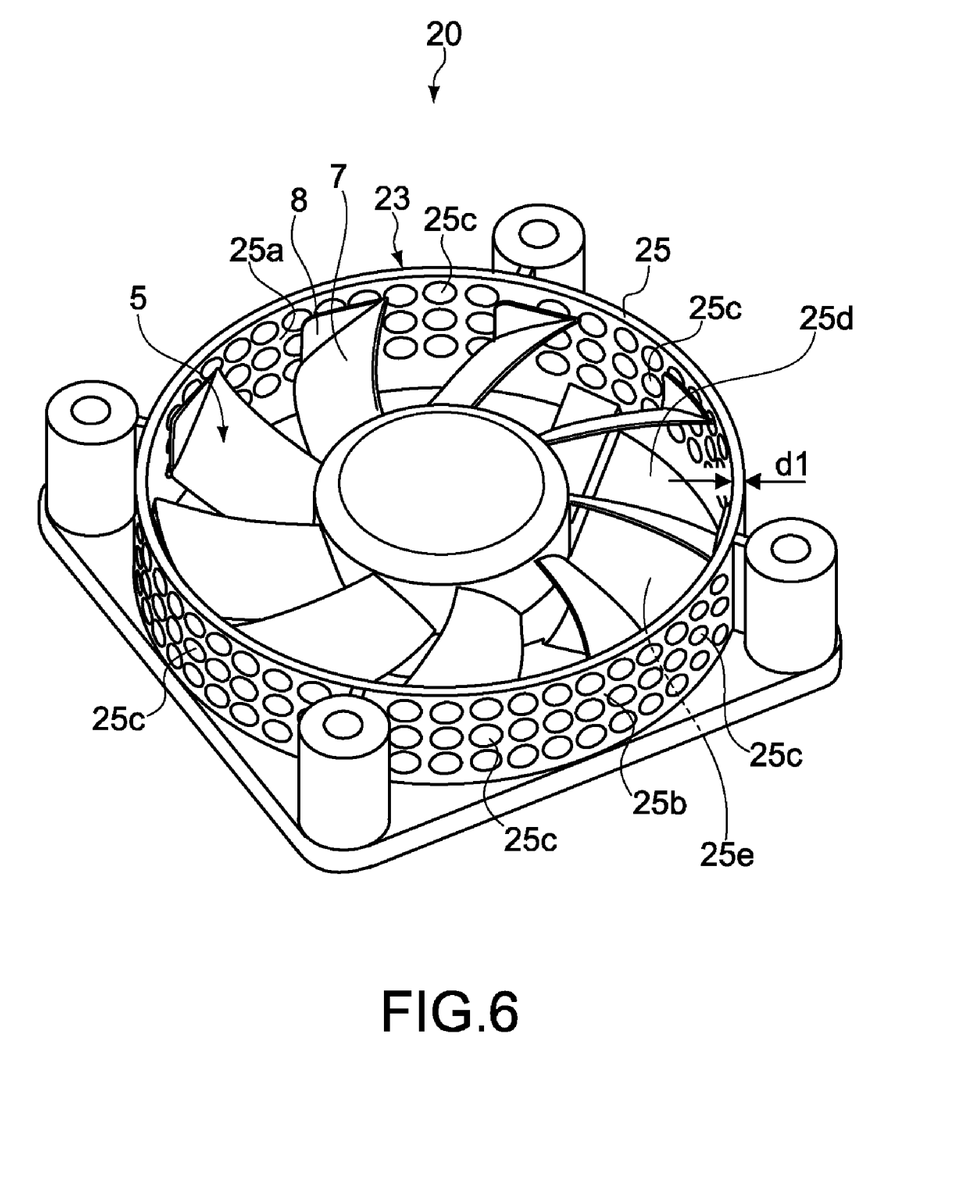
FIG. 6 is a view showing an axial fan apparatus according to another embodiment of the present invention.

FIG. 6 is a view showing an axial fan apparatus according to another embodiment of the present invention. In the description hereinbelow, descriptions on members and functions similar to those of the axial fan apparatus 10 according to the embodiment shown in FIG. 1 and the like will be simplified or omitted, and description will mainly be given on the differences.

A housing 23 of an axial fan apparatus 20 according to this embodiment includes an annular sidewall 25. Specifically, the sidewall 25 has an annular inner circumferential surface 25a and an annular outer circumferential surface 25b and is formed with substantially the same thickness d1. The housing 23 includes a suction port 25d at an upper portion of the sidewall 25 and a discharge port 25e at the bottom of the sidewall 25. The axial-flow impeller 5 is housed inside the sidewall 25. It should be noted that the axial-flow impeller 5 shown in FIGS. 3A and 3B is used as the axial-flow impeller 5 in this case.

Figure 7:
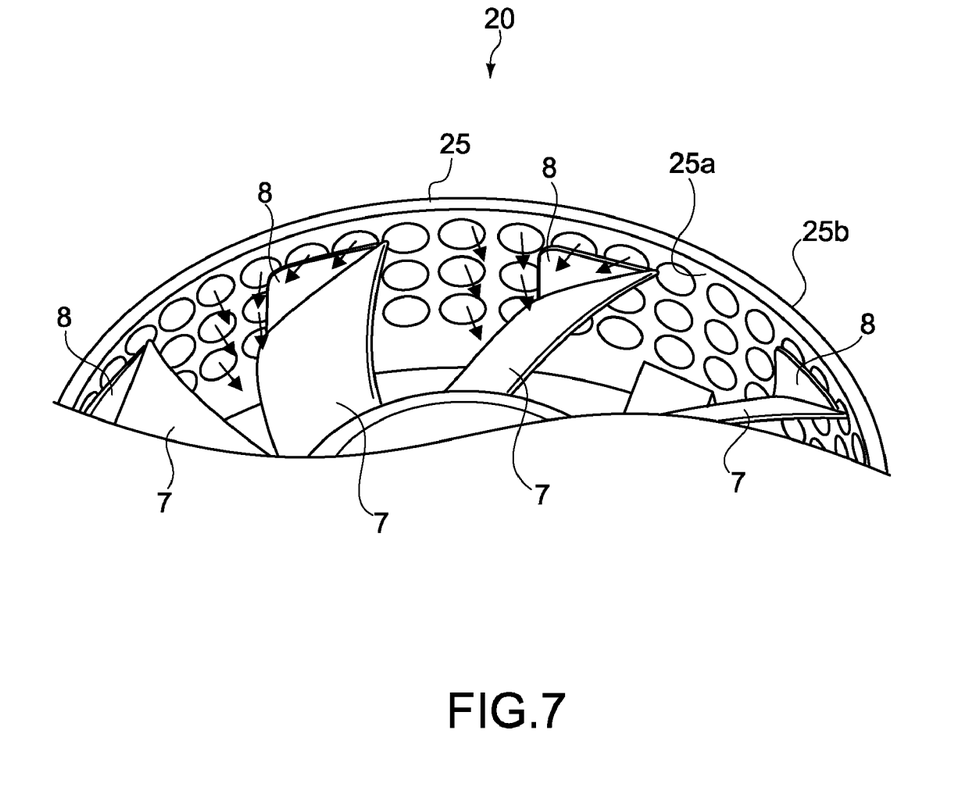
FIG. 7 is a view showing a part of an axial-flow impeller and inner circumferential surface of a sidewall shown in FIG. 6.

FIG. 7 is a view showing a part of the axial-flow impeller 5 and the inner circumferential surface 25a of the sidewall 25. The sidewall 25 is provided with a plurality of vent holes 25c. The rotation of the axial-flow impeller 5 generates a negative pressure on the negative pressure generation surface 7a of the axial-flow wing 7, and air flows into the housing 23 via the vent holes 25c. In other words, the vent holes 25c function as second suction ports. The airflows from the vent holes 25c flow toward the negative pressure generation surfaces 7a, but the presence of the auxiliary vane 8 causes the airflows to join the airflows that try to flow in from the back surface side of the axial-flow wing 7 to thus facilitate rectification. Therefore, quietness can be further improved and the blast volume can be increased.

As described above, because the thickness d1 of the sidewall 25 is substantially constant, it is possible to increase a total area of the openings of the vent holes 25c as compared to the sidewalls 3e having excessive thickness (sidewalls 3e with large thickness) as shown in FIG. 1. For example, as compared to the case where the vent holes are formed on the planar sidewalls 3e of the housing 3 as shown in FIG. 1, it is possible to increase the number of vent holes 25c in the case where the vent holes 25c are formed on the annular sidewall 25 as shown in FIG. 6. Accordingly, the intake volume as well as the blast volume can be increased.

Figure 8:
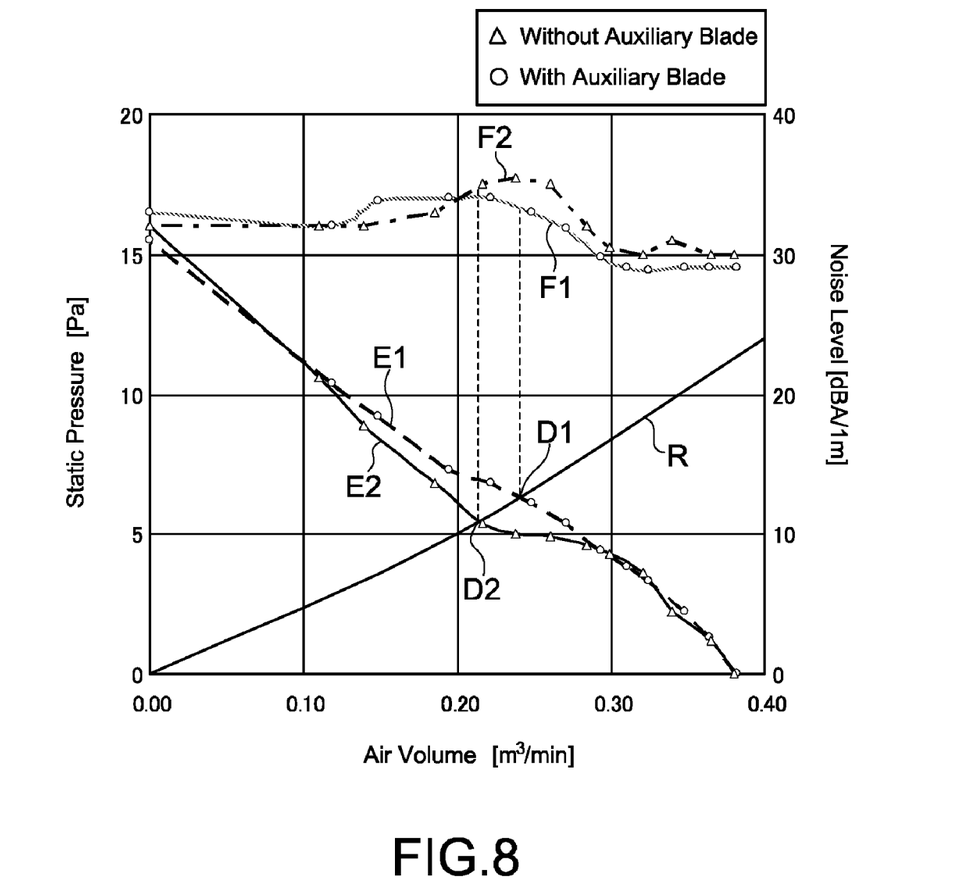
FIG. 8 is a graph showing measurement results of a P-Q characteristic and a noise level regarding an axial fan apparatus with no auxiliary vane and the axial fan apparatus shown in FIG. 1.

FIG. 8 is a graph showing measurement results of a P-Q characteristic (air volume-static pressure characteristic) and a noise level regarding an axial fan apparatus with no auxiliary vane 8 and the axial fan apparatus 10 shown in FIG. 1. Static pressure curves are represented by reference symbols E1 (with auxiliary vanes) and E2 (without auxiliary vanes), respectively, and the noise levels are represented by reference symbols F1 (with auxiliary vanes) and F2 (without auxiliary vanes), respectively. The noise level indicates the noise level at a 1 m distance.

Generally, the axial fan apparatuses operate with air volumes of ±20% with half the maximum air volume as a standard, particularly, air volumes at intersections D1 and D2 between the static pressure curves E1 and E2 and a system impedance R. Regarding the axial-flow wings 7 with and without the auxiliary vane 8 at the same static pressure, it can be seen that in the vicinity of the intersection D1 (or D2), the air volume is higher and the noise is more reduced in the case of the axial-flow wing 7 with the auxiliary vane 8 than the case of the axial-flow wing 7 without the auxiliary vane 8.

The inventors of the present invention have similarly conducted measurements on the P-Q characteristic and the noise level with respect to the axial-flow impeller (not shown) whose axial-flow wings 7 are each provided with the auxiliary vane 8 standing upwardly on the back surface 7b side thereof. The results were the same as that without the auxiliary vanes 8.

Figure 9:
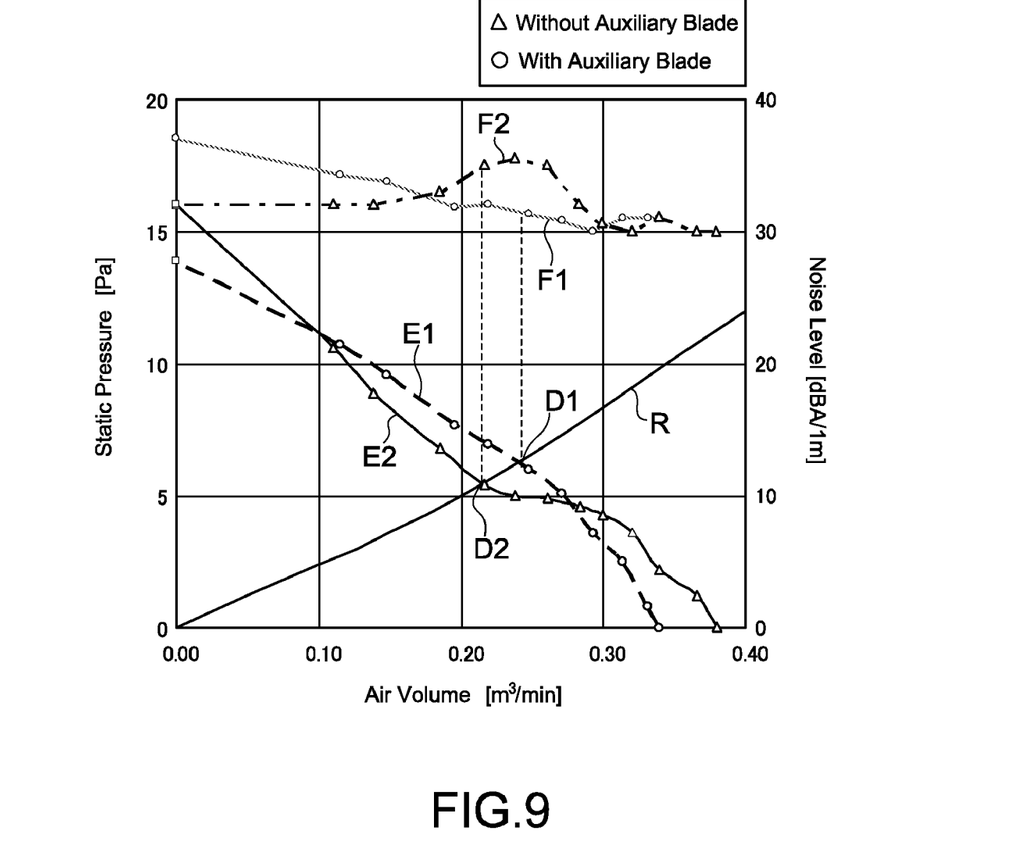
FIG. 9 is a graph showing measurement results of the P-Q characteristic and the noise level regarding the axial fan apparatus shown in FIG. 6.

FIG. 9 is a graph showing measurement results of the P-Q characteristic (air volume-static pressure characteristic) and the noise level regarding the axial fan apparatus 20 shown in FIG. 6. As can be seen from the graph, the axial fan apparatus 20 shown in FIG. 6 can further reduce noises than the axial-fan apparatus 10 shown in FIG. 1.

It should be noted that the housing 3 (or 23) of the axial fan apparatus 10 (or 20) used in the experiment is approximately 60 mm-square in size and a diameter of the axial-flow impeller 5 is approximately 57 to 59 mm. However, the size of the axial fan apparatus 10 (or 20) is not limited to those described above.

Figure 10:
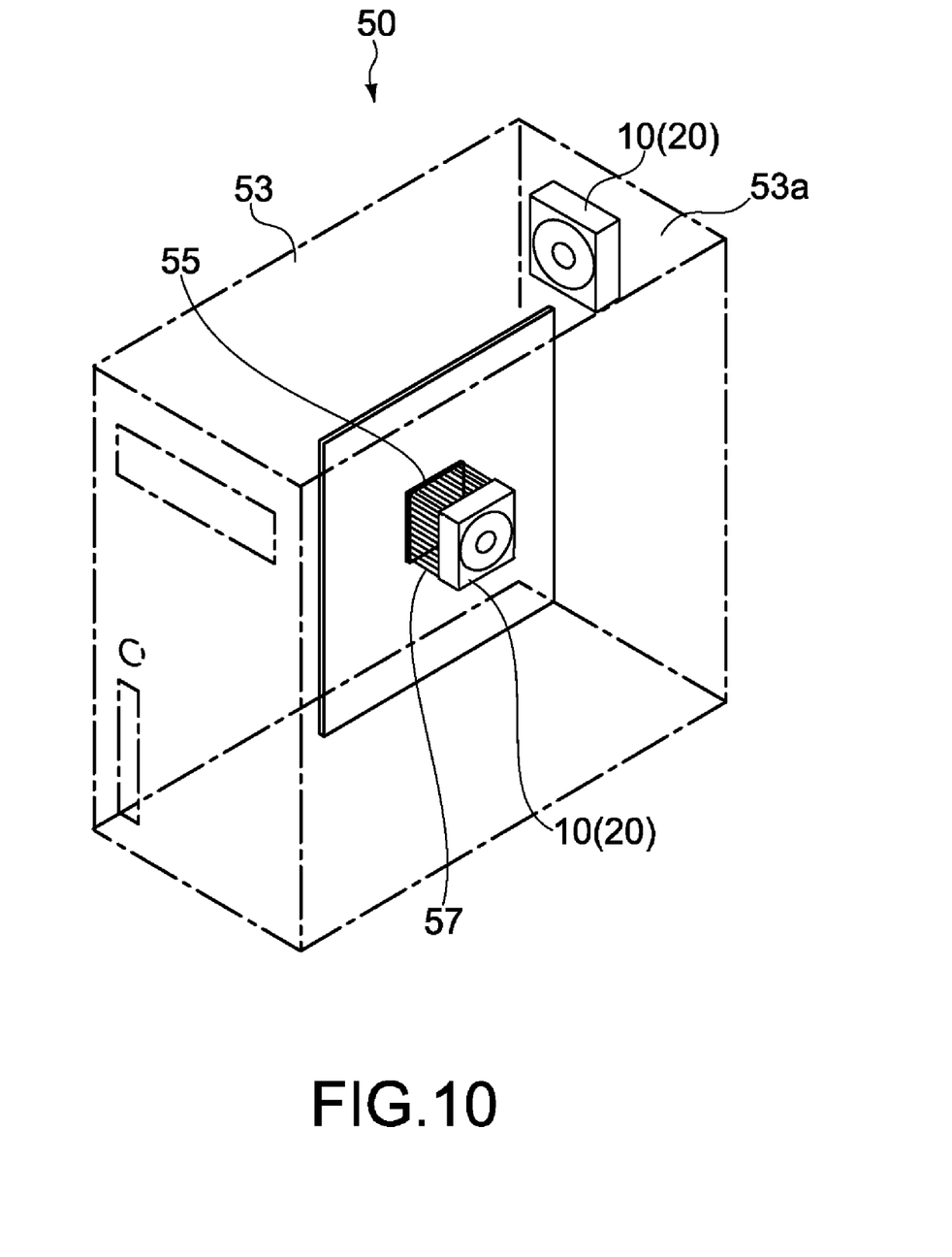
FIG. 10 is a schematic perspective view showing a desktop PC as an electronic apparatus according to an embodiment of the present invention.

FIG. 10 is a schematic perspective view showing a desktop PC (Personal Computer) as an electronic apparatus according to an embodiment of the present invention.

A PC 50 includes a casing 53 into which the axial fan apparatus 10 (or 20) is incorporated. The axial fan apparatus 10 (or 20) is fixed to, for example, an opening (not shown) provided on a back surface 53a of the casing 53. Alternatively, the axial fan apparatus 10 (or 20) is fixed to a heat sink 57 connected to a CPU 55, for example.

The electronic apparatus is not limited to the PC 50, and other examples thereof include a server-type computer, a display apparatus, an audio/visual apparatus, a projector, a game apparatus, a car navigation apparatus, and other electrical appliances.

Embodiments of the present invention are not limited to the above embodiments, and various other embodiments may also be employed.

The vent holes 25c formed in the housing 23 shown in FIG. 6 are formed to be substantially round, but the shape thereof may be any shape including a slit and a slotted hole. When slits are formed as the vent holes 25c, the slits may be formed such that its longitudinal direction is set in an oblique direction.

The vent holes 25c may also be formed on the sidewalls 3e of the housing 3 of the axial fan apparatus 10 shown in FIG. 1.

What is claimed is:

1. An axial fan apparatus, comprising:
   a housing; and
   an axial-flow impeller capable of rotating inside the housing and that includes a plurality of axial-flow wings each having (a) a negative pressure generation surface for generating a negative pressure and (b) an auxiliary vane at an end portion of the respective negative pressure generation surface,
   wherein,
      each auxiliary vane includes an edge substantially parallel to a rotation plane of the axial-flow impeller.

2. The axial fan apparatus according to claim 1, wherein the housing includes a sidewall on which a plurality of vent holes are formed.

3. The axial fan apparatus according to claim 2, wherein the sidewall includes an annular inner circumferential surface and an annular outer circumferential surface.

4. An axial-flow impeller provided in an axial fan apparatus including a housing, comprising:
   a boss portion provided to be rotatable inside the housing; and
   a plurality of axial-flow wings each having (a) a negative pressure generation surface for generating a negative pressure and provided on a periphery of the boss portion and (b) an auxiliary vane at an end portion of the respective negative pressure generation surface,
   wherein,
      each auxiliary vane includes an edge substantially parallel to a rotation plane of the axial-flow impeller.

5. An electronic apparatus, comprising:
   a casing;
   a housing disposed inside the casing; and
   an axial-flow impeller capable of rotating inside the housing and that includes a plurality of axial-flow wings each having (a) a negative pressure generation surface for generating a negative pressure and (b) an auxiliary vane at an end portion of the respective negative pressure generation surface,
   wherein,
      each auxiliary vane includes an edge substantially parallel to a rotation plane of the axial-flow impeller.

* * * * *